US006762606B2

United States Patent
Jevtic et al.

(10) Patent No.: US 6,762,606 B2
(45) Date of Patent: Jul. 13, 2004

(54) RETRACTING MRI HEAD COIL

(75) Inventors: Jovan Jevtic, West Allis, WI (US); Ashok Menon, Milwaukee, WI (US); Derek Seeber, Wauwatosa, WI (US); Matthew J. Mercier, Menomonee Falls, WI (US); Steven M. Zwolinski, Brookfield, WI (US); Matthias Gyori, Brookfield, WI (US)

(73) Assignee: IGC-Medical Advances, Inc., Milwaukee, WI (US)

( * ) Notice: Subject to any disclaimer, the term of this patent is extended or adjusted under 35 U.S.C. 154(b) by 48 days.

(21) Appl. No.: 10/303,582

(22) Filed: Nov. 22, 2002

(65) Prior Publication Data

US 2004/0100346 A1 May 27, 2004

(51) Int. Cl.[7] .................................................. G01V 3/00
(52) U.S. Cl. ........................................ 324/318; 600/422
(58) Field of Search ................................ 324/318–320; 600/410, 421, 422

(56) References Cited

U.S. PATENT DOCUMENTS

| 5,277,183 | A  |   | 1/1994 | Vij |
|-----------|----|---|--------|------|
| 5,557,247 | A  | * | 9/1996 | Vaughn, Jr. ................. 333/219 |
| 5,619,996 | A  |   | 4/1997 | Beresten |
| 5,917,324 | A  | * | 6/1999 | Leussler ...................... 324/318 |
| 6,040,697 | A  | * | 3/2000 | Misic .......................... 324/318 |
| 6,396,271 | B1 | * | 5/2002 | Burl et al. ................... 324/318 |

* cited by examiner

Primary Examiner—Ramon M. Barrera
(74) Attorney, Agent, or Firm—Quarles & Brady LLP

(57) ABSTRACT

A head coil for magnetic resonance imaging may be shortened longitudinally to provide for better access by a patient. Extension of the coil may be performed after the positioning of the patient's head significantly simplifying patient positioning with respect to the coil. A portion of a conductor support sliding over the patient's head removable to allow endotracheal tubes or the like to remain undisturbed.

29 Claims, 5 Drawing Sheets

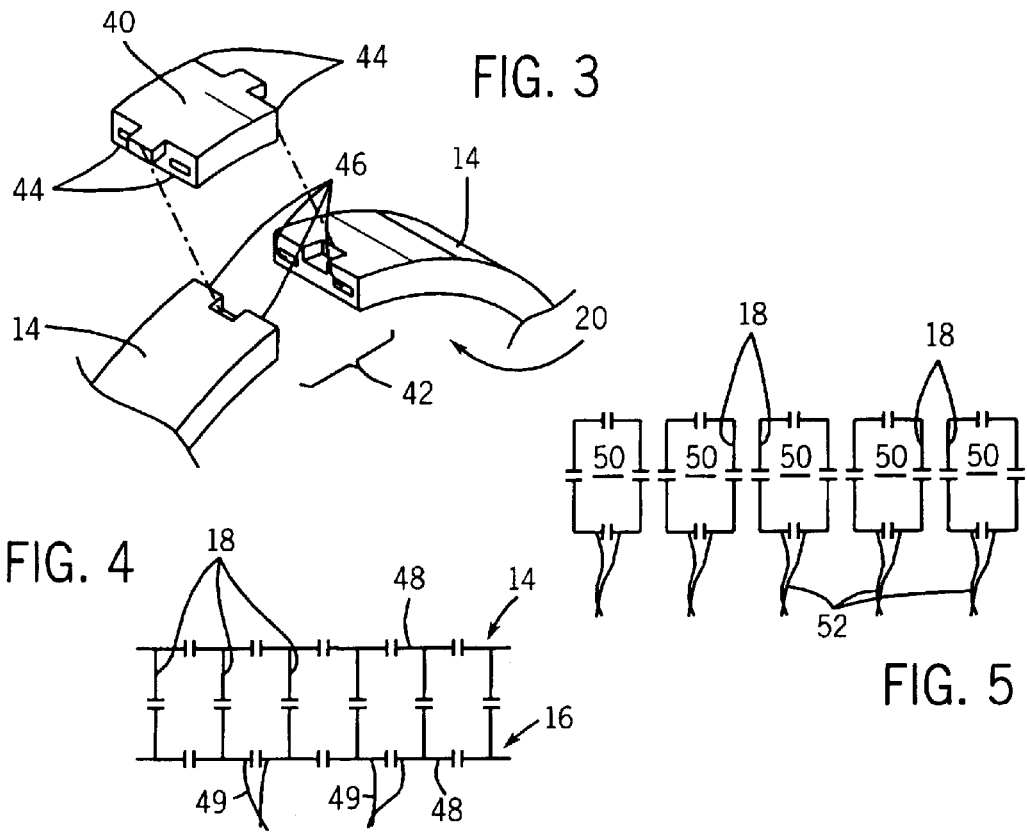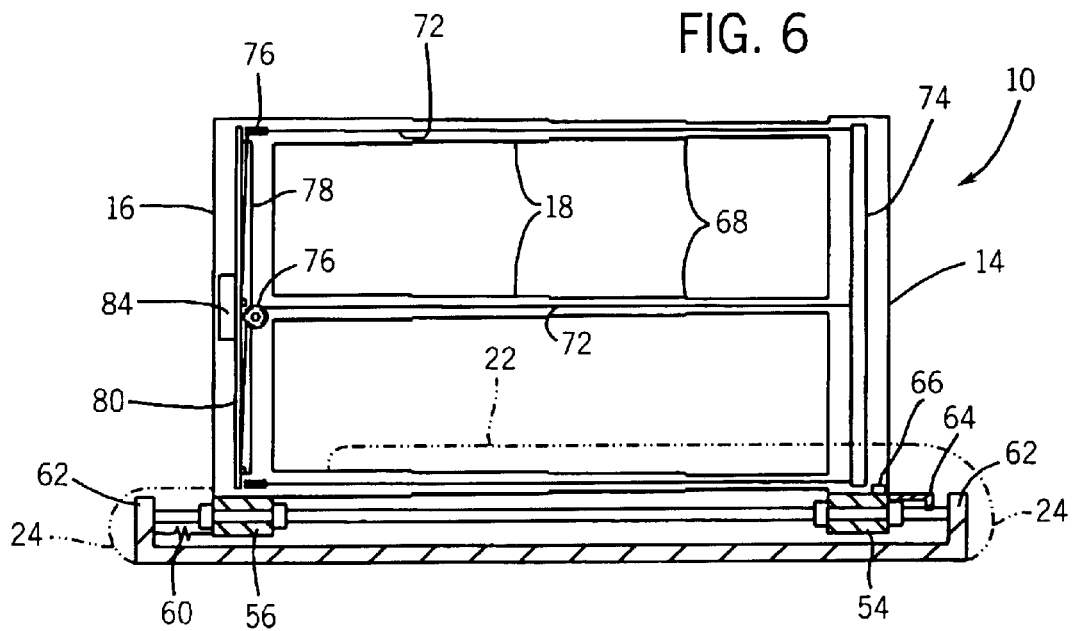

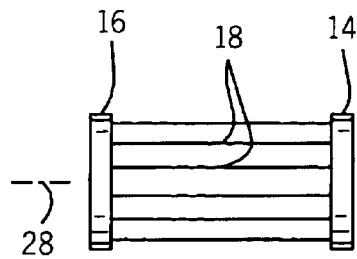
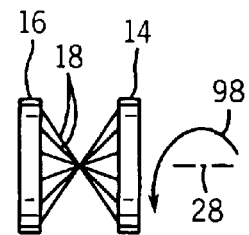
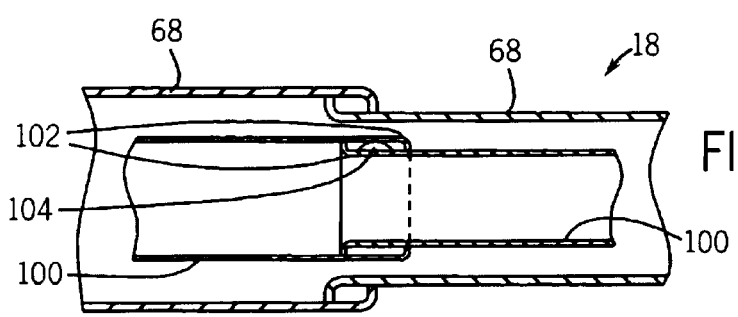
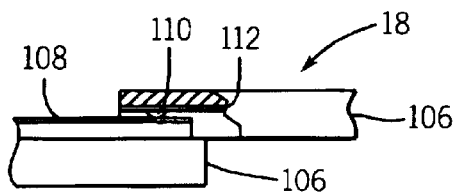
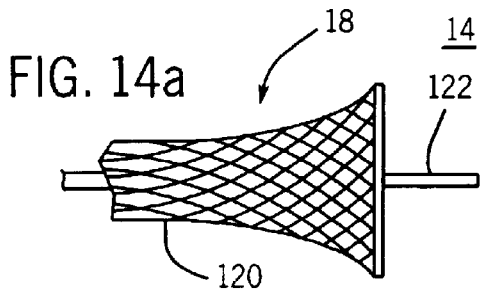
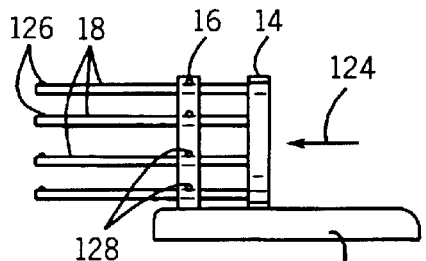
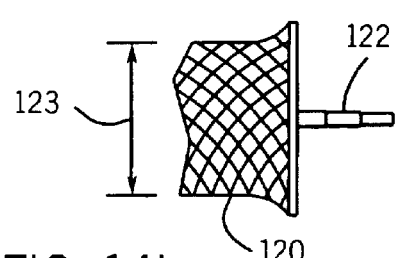
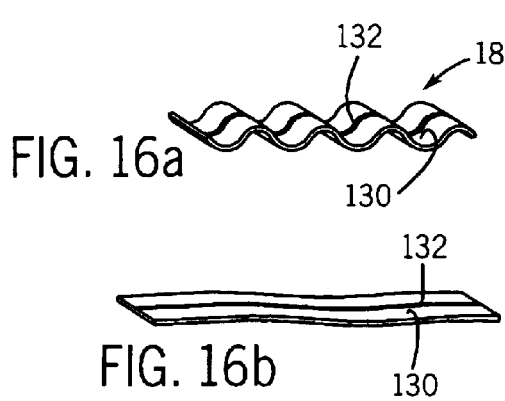

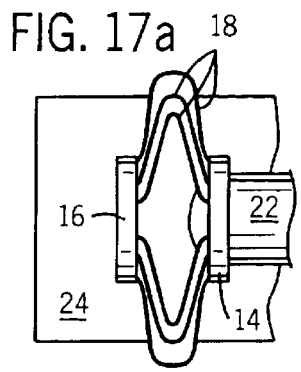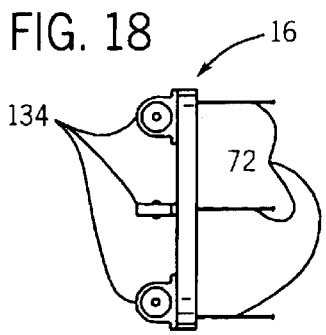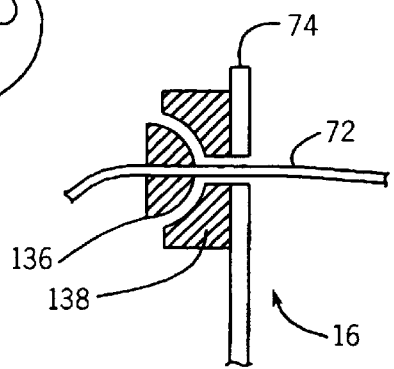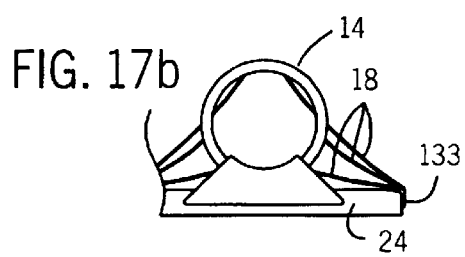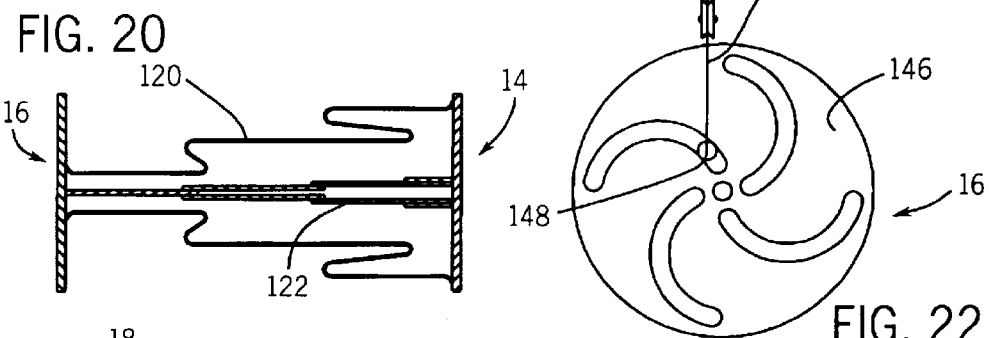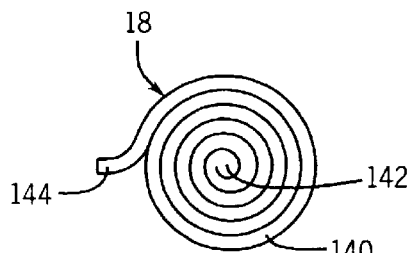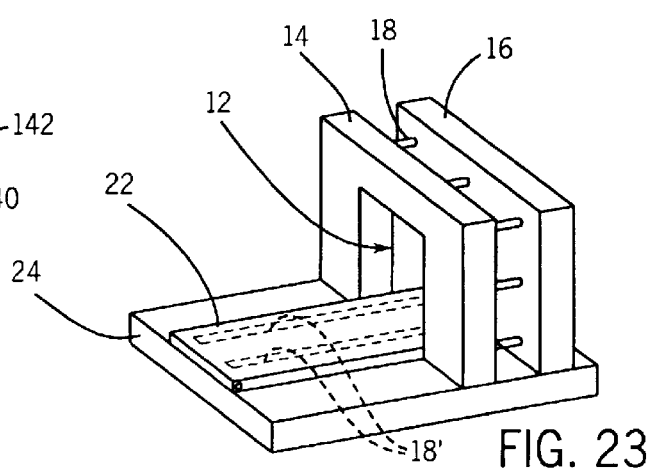

RETRACTING MRI HEAD COIL

CROSS-REFERENCE TO RELATED APPLICATIONS

STATEMENT REGARDING FEDERALLY SPONSORED RESEARCH OR DEVELOPMENT

BACKGROUND OF THE INVENTION

The field of the invention is magnetic resonance imaging, and in particular local coils for using in magnetic resonance imaging of the head.

Magnetic resonance imaging (MRI) provides images, for example, of a human patient, by detecting faint signals from precessing hydrogen protons under the influence of a strong magnetic field and after a radio frequency excitation.

The quality of the image produced by MRI is strongly dependent on the strength of the received signal. For this reason, it is known to use radio frequency receiving coils placed in close proximity to the area being imaged. Such coils are called local coils.

A common local coil used for head or brain imaging is the so-called "bird cage" design providing a set of longitudinal conductors arrayed about the periphery of a cylindrical volume and terminated by conductor supports aligned with the bases of the cylindrical volume. The patient's head fits through one conductor support into the enclosed volume. The coil may operate with the longitudinal conductors joined into a unitary resonant structure or with the longitudinal conductors isolated to provide a phased array of separate antennas.

Birdcage coils can be difficult to position on patients, often requiring one person to lift the patient's head while the conductor support of the coil is positioned over the patient's head. For this reason, split birdcage coils have been developed where the coil is separable along a horizontal plane bisecting the cylindrical volume. The lower portion of the coil forming a shallow trough may be pre-positioned on the table and the patient's head located in this trough when the patient is positioned on the table. After the patient is in position, the upper portion of the coil may be fitted onto the lower portion to complete the coil.

A disadvantage of this design is that it requires two parts, one of which must be momentarily stored in another location while the patient is positioned. Generally, two hands are required to lift the top part of the coil into position.

In an alternative design, the patient's head is positioned on a support held in cantilevered fashion so that the coil may slide around the support after the patient is in position. A drawback to this design is that the coil and support occupy a much greater space along the length of the table when they are separated, and in some cases, the coil may extend over the end of the table where it may catch on the bore of the magnet when the patient table is raised or lowered.

When a patient is intubated, for example, with an endotracheal tube, the tube may interfere with positioning of the patient in the coil or the coil about the patient.

BRIEF SUMMARY OF THE INVENTION

The present invention provides a head coil that may be shortened along its longitudinal axis to allow easy placement of the patient onto a contained head rest. The coil is then lengthened over the patient for imaging. The resulting coil may be operated with one hand and does not require the storage or movement of separable parts. Because the coil is shortened, the end of the coil need not extend off the end of the table to interfere with the operation of the table and the magnet.

One conductor support of the coil may be equipped with a removable bridge so when the coil is lengthened, the conductor support may pass freely by an endotracheal tube or the like.

Specifically, the present invention provides an MRI head coil having a longitudinally extending head support sized to support the head of a supine patient. A first conductor support is positioned superior to the head support. A second conductor support having an opening for receiving the head support therethrough is mounted to move longitudinally with respect to the head support and the first conductor support. The second conductor support moves between a first position toward the first conductor support and a second position away from the first conductor support. A set of conductors extends longitudinally between the first and second conductor supports when the second conductor support is in the second position to define together with the first and second conductor supports, a volume substantially enclosing the patient's head.

It is thus one object of the invention to produce a coil that may be shortened to allow access to the imaging volume for positioning and attending to the patient.

It is another object of the invention to provide a high degree of access to the patient prior to imaging without unduly increasing the footprint for supporting the head coil.

It is another object of the invention to provide a coil that allows easy access to the patient prior to imaging that may be operated with one hand and does not require the operator to leave the patient's side in order to obtain another coil component.

The first conductor support may be mounted relative to the head support to also move longitudinally with respect to the head support.

Thus it is another object of the invention to provide greater access to the patient than can be obtained by shortening the coil alone.

The first and second conductor supports and head support can be mounted on a base sized to be received on a patient table.

Thus it is another object of the invention to provide a simple and stable mounting of the moveable components of the present design.

The second conductor support may be a ring surrounding the head support or an inverted U having arms flanking a stationary base wherein the base includes longitudinal conductors.

Thus it is another object of the invention to provide for a reduction in the need for collapsible conductors in the base portion which may remain uncompressed.

The longitudinal conductors may be connected to form a single resonant structure or phased array of separate antennas.

Thus it is another object of the invention to provide for a coil design and accommodates two principal types of head coils.

The longitudinal conductors may form a resonant circuit tuned to the NMR frequency when the second conductor support is in the second position and detuned when the second conductor is in the first position.

Thus it is another object of the invention to provide a coil that is automatically detuned and thus decoupled from RF fields when it is in the collapsed condition.

The second conductor support may include a removable bridge portion over a portion of the opening passing by the patient's nose and mouth when the patient's head is on the patient support and the second conductor support is moved from the first position to the second position.

Thus it is another object of the invention to provide a coil that does not interfere with endotracheal tubes and the like.

These particular objects and advantages may apply to only some embodiments falling within the claims and thus do not define the scope of the invention.

DESCRIPTION OF THE DRAWINGS

FIG. 3 is a detailed fragmentary view of the front conductor support of the coil showing a removable bridge section allowing passage of the front conductor support past the endotracheal tube in FIG. 2 when the coil is lengthened;

FIG. 4 is a schematic diagram of interconnected coil elements contained in the coils of FIGS. 1 through 3 when implemented as a single resonant structure;

FIG. 5 is a figure similar to that of FIG. 4 showing a schematic when the coils are implemented in a phased array of separate coils;

FIG. 6 is a side elevational cross-section of the coil of FIG. 1 showing the placement of flexible conductors extending between the conductor supports within telescoping insulating tubes and showing a take-up reel positioned in the superior conductor support to wind the flexible conductors when the coil is shortened;

FIGS. 11a and 11b are an alternative embodiment in which relative rotation of the conductor supports is used to take up slack in the longitudinal conductors on shortening of the coil;

FIG. 12 is a fragmentary view of one longitudinal conductor in yet another alternative embodiment in which outer telescoping insulating tubes are positioned about inner conductive telescoping tubes serving as longitudinal conductors;

FIGS. 13a and 13b are front and side elevational views of an alternative longitudinal conductor using interengaging tracks providing rigid conductors that may interconnect;

FIGS. 14a and 14b are yet an alternative embodiment using a braided conductor whose diameter shrinks about a rigid telescoping form with extension of the coil;

FIG. 15 is a side elevational diagram of yet another embodiment of the coil in which rigid conductors pass through the second end plate to allow shortening of the coil;

FIGS. 16a and 16b are fragmentary views of a flexible conductor pre-stressed to fold into an accordion to take up slack when the coil is shortened;

FIGS. 17a and 17b are a simplified representation of a coil in which flexible conductors are drawn to the side when the coil is shortened;

FIG. 18 is a elevational view of a retractor mechanism using individual retractor coils in each of the flexible conductors such as may be contained in one conductor support;

FIG. 19 shows a connector system allowing electrical connection of the longitudinal conductors of FIG. 18 when they are fully extended;

FIG. 20 is a cross-sectional view of the braid for FIGS. 14 and 15 in which internal convolution of the braid serves to collect excess conductor length;

FIG. 21 is a collapsed view of a spiral conductor that may be extended and collapsed to accommodate the lengthening and shortening of the coil;

FIG. 22 shows yet further embodiment of a retractor mechanism that may be held in the second conductor support using a cam follower that draws the ends of the longitudinal conductors inward upon shortening of the coil; and FIG. 23 is a perspective view of an alternative embodiment in which one or more longitudinal conductors are embedded in the base so as to not require collapsing when the coil conductor supports are moved into an adjacent configuration.

DETAILED DESCRIPTION OF THE PREFERRED EMBODIMENT

Figure 1:
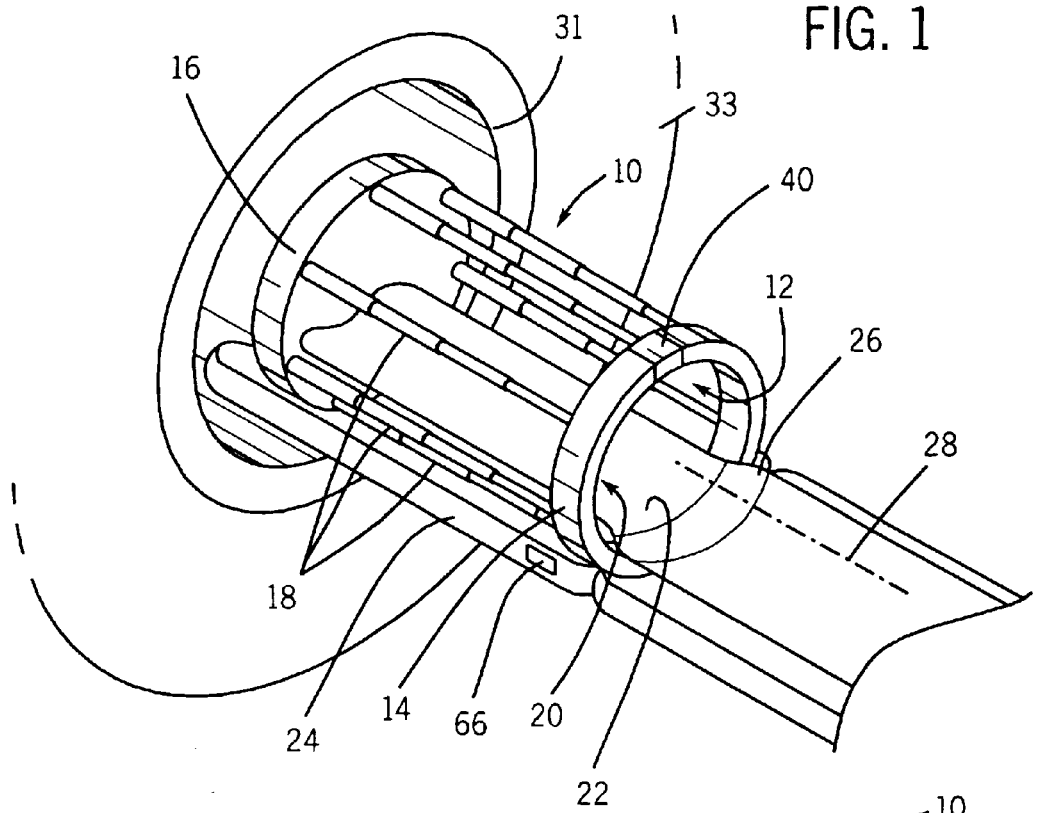
FIG. 1 is a perspective view of a head coil of the present invention showing positioning of the coil on a patient table in the lengthened form normally used after the patient's head is positioned in the head coil.

Referring now to FIG. 1, a head coil 10 of the present invention, in a lengthened state, detects signals for MRI imaging from a generally cylindrical volume 12 defined by a first and second conductor support 14 and 16 spanned by a series of longitudinally extending conductors 18 arranged about the periphery of the conductor supports 14 and 16. The conductor supports 14 and 16 are sized to fit within the bore 31 of an MRI magnet with the axis of the cylindrical volume 12 aligned with the longitudinal axis 28 of the bore 31.

Generally, the volume 12 need not be a perfect cylinder but may be flattened as is understood in the art. The longitudinal conductors 18 need not be parallel to the longitudinal axis so long as they extend longitudinally, that is, have a component of longitudinal extension. Thus the present invention is suitable for SENSE type coils such as are described in co-pending application Ser. No. 10/303,582 using triangular or other loop types.

The conductor support 14 includes an opening 20 sized to receive a patient's head. A head support 22 extends into the opening 20 to lie near the lower periphery of the cylindrical volume 12 and is attached outside of the opening 20 to a base 24. The base 24 is sized to fit on top of a patient table 26 extending along the longitudinal axis 28 and also holds the conductor supports 14 and 16 as will be described.

Figure 2A:
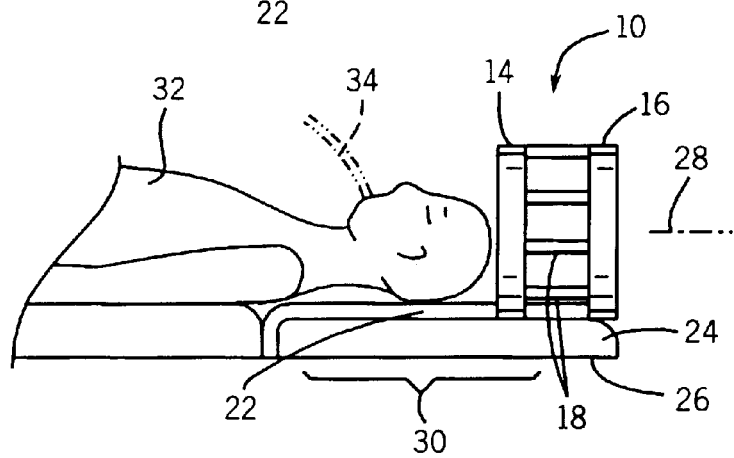
FIG. 2a is a side elevational view of the coil of FIG. 1 in the shortened position showing accessibility to an intubated patient from the sides or top.

The head coil 10 in FIG. 1 is shown in its lengthened state. Referring to FIG. 2a, the head coil 10 of FIG. 1 may be moved to a shortened state in which conductor supports 14 and 16 slide together along longitudinal axis 28. During the shortening, conductor support 16 may also move slightly in the superior direction. The combined shortening and movement of conductive support 16 opens access region 30 allowing positioning of the head of a patient 32 laterally or vertically onto head support 22. The access region 30 also provides access to the patient's head prior to imaging.

Figure 2B:
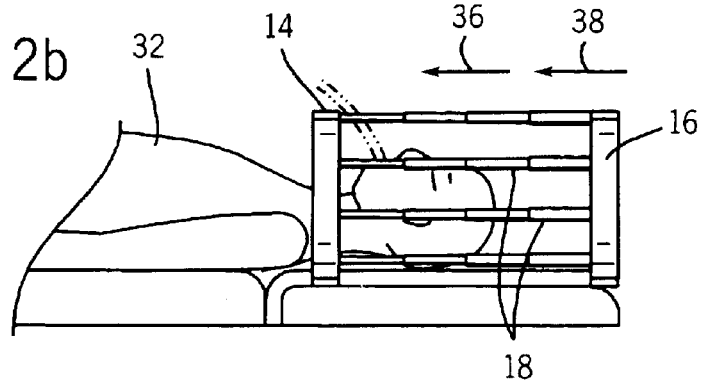
FIG. 2b is a figure similar to that of FIG. 2a showing the coil in the lengthened position about the patient.

Referring now to FIG. 2b, conductor support 14 may be shifted as indicated by arrow 36 in an inferior direction over the head of the patient 32 lengthening the head coil 10. This shifting may optionally include a slight amount of sliding of conductor support 16 in the inferior direction as well as indicated by arrow 38. After the lengthening of the head coil 10, the head of the patient 32 is contained within the volume 12.

Referring momentarily to FIGS. 3 and 1, the conductor support 14 may include a bridge 40 positioned at the top of the opening 20. The bridge 40 may be removed providing a passage 42 in the wall of opening 20 through which an endotracheal tube 34 may pass. Thus, if the patient 32 is intubated with an endotracheal tube 34, this tube or similar devices need not be removed during the lengthening of the head coil 10 or the imaging. The bridge 40 may have key sections locking it to the conductor support 14 when it is in place and provides electrical connectors 44 that join with corresponding connectors 46 on the open ends of the passage 42. In a preferred embodiment, the bridge 40 is hinged to the conductor support 14 (not shown) so as to not be misplaced.

Referring now to FIGS. 1 and 4, each of the longitudinal conductors 18 may be joined as a single resonant structure in which their ends are joined by segments of conductive rings 48 which may be positioned within the conductor supports 14 and 16 and of which bridge 40 provides a part. The rings are tuned to provide a standing wave at the resonant frequency of interest as is well understood in the art. One or two quadrature leads 49 may extend form the conductor support 16 where they attach to the internal loop as is well understood in the art.

Alternatively, as shown in FIG. 5, each of the longitudinal conductors 18 may carry two conductors such as forms opposite sides of independent phased array coils 50. In this case, the conductor supports 14 and 16 do not contain a continuous ring but contain short segments making up parts of the separate phased array coils 50. Separate conduction leads for each of the coils 52 may be routed typically from conductor support 16 (not shown).

Referring now to FIG. 6, each of the conductor supports 14 and 16 may be mounted on carriers 54 and 56, respectively, riding on tracks 58, for example, a rod held by supports 62, to slide longitudinally thereupon. Carrier 56 of conductor support 16 may be biased by spring 60 to support 62 at the superior end of the head coil 10 so as to naturally be drawn to that end except when pulled by tension on the longitudinal conductors 18 excreted by conductor support 14. Conductor support 14 may be pulled manually to the inferior end of the head coil 10 and held by a catch 64 engaging the track 58 as activated by a user accessible button 66. The tracks 58 may provide resistance to twisting and allow single-handed operation of the carriers 54 in lengthening the head coil 10.

Figure 8:
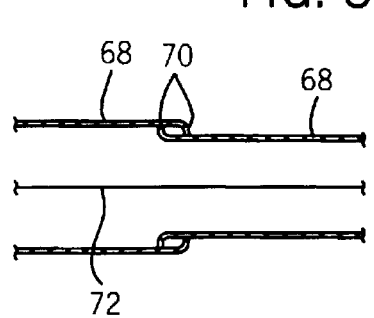
FIG. 8 is a detailed cross-section of a telescoping tube joint of FIG. 6 showing the contained flexible conductor.

To accommodate the varying separation between the conductor supports 14 and 16, longitudinal conductors 18 may include an outer sheath of insulating telescoping tubes 68. Referring also to FIG. 8, each tube 68 fits within the preceding tube 68 to be retained from separation by interengaging flanges 70. A sufficient number of tube segments is used so as to provide for a compliance or lapse distance of approximately eighty percent.

The tubes 68 retain in their center a flexible conductor 72 that provides for the conduction of the longitudinal conductor. The conductor 72 may be a flexible wire, metal braid, foil or other flexible conductive material.

Figure 7:
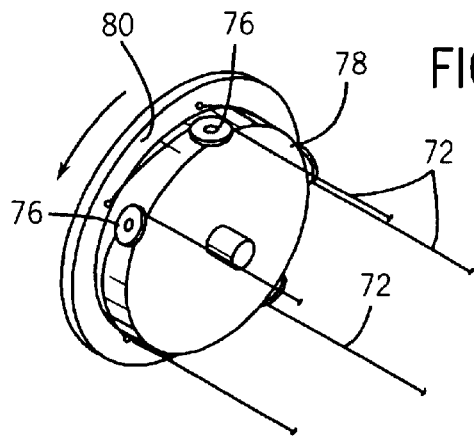
FIG. 7 is a perspective fragmentary view of the interior of the conductor support of FIG. 6 showing guide wheels guiding the flexible conductors onto a central take-up reel.

Referring now to FIGS. 6 and 7, one end of the flexible conductors 72 may be attached to a generally disk-shaped printed circuit board 74 held within the conductor support 14 to provide for the electrical interconnection and tuning circuitry and connecting cable interfaces. The length of the conductors 72 then extend through the insulating tubes 68 as part of the longitudinal conductors 18 to the conductor support 16 and within its housing to be received by idler pulleys 76. Idler pulleys 76 have radial axes and direct the conductors 72 along the circumference of a take-up reel 78, the take-up reel 78 rotatable about a longitudinal axis and fitting within the housing of the conductor support 16:

The take-up reel 78 may be rotationally spring biased by a constant force spring 81 so that with collapse of the coil 10, moving conductor supports 14 and 16 together, conductors 72 are directed around radial pulleys 76 and are wrapped about an outer circumference of the take-up reel 78 as it turns. Attached to a back surface of the take-up reel 78 to rotate with it is a printed circuit board 80 (corresponding electrically to printed circuit board 74) to which conductors 72 may be terminated within the conductor support 16. Bending of the conductor 72 is minimized and points of electrical connection and disconnection, which may have varying resistances and/or capacitances, are avoided by having ends of conductor 72 always permanently affixed to their respective circuit boards 80 and 74.

Figure 9A:
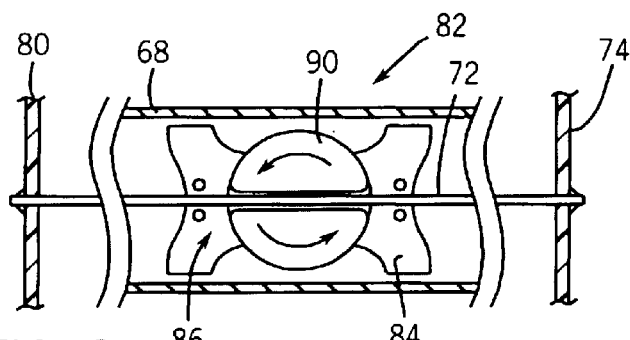
FIG. 9a and 9b are top plan views of a self-winder that may be used instead or in addition to the take-up reel of FIG. 7 to wind the flexible conductor when the coil is shortened.
Figure 9B:
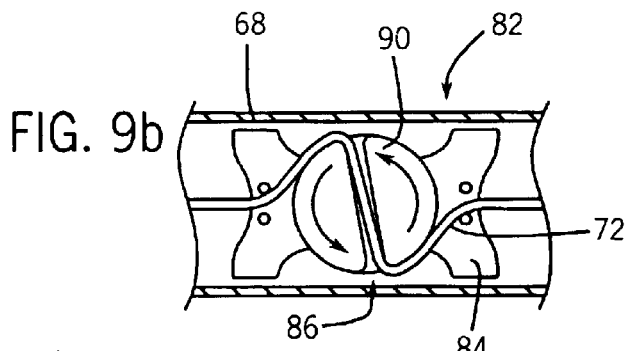

Referring now to FIGS. 9a and 9b, in an alternative embodiment, the take-up reel 78 is eliminated and modular self-winders 82 are placed within the insulating tubes 68. The self-winders include a base 84 holding the self-winder 82 against rotation within the tube 68 and a jaw 86 through which the conductor 72 may pass. The jaw 86 is biased by a constant force spring as indicated by arrows 90 so that when slack is obtained in the conductor 72, as shown in FIG. 9b, the jaw 86 rotates and wraps the conductor 72 about its outer circumference. One or more self-winders 82 may be used on each longitudinal conductor 18 and enlarged sections of the tubes 68 may be provided for the purpose of holding these self-winders 82. Again, the conductors 72 remain permanently attached to the respective circuit boards 74 and 80.

Figure 10A:
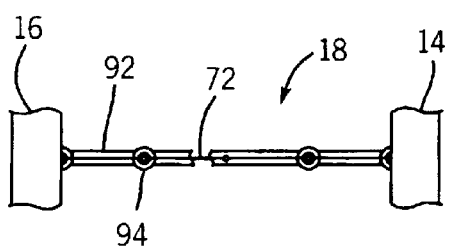
FIG. 10a and 10b are fragmentary views of a longitudinal conductor according to a second embodiment in which an outer insulated sheath is a jointed tube that may articulate with shortening of the coil.
Figure 10B:
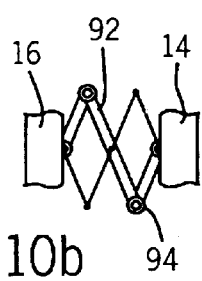

Referring now to FIGS. 10a and 10b, the flexible conductors 72 may in an alternative embodiment be contained in tubes 92 connected by means of joints 94 so as to articulate or bend about radial or circumferential axes when conductor supports 14 and 16 are moved together. The bending may be in an accordion fashion to reduce possible interference with the patient and/or bore. Again the internal conductor 72 may be a flexible metallic member or the like.

Referring now to FIGS. 11a and 11b, in yet another alternative embodiment, the longitudinal conductors 18 may be flexible conductors with flexible insulating sheaths or alternatively stiff metal members with insulating coverings mounted for rotation and angulation at the conductor supports 14 and 16. In this embodiment, the one or both of the conductor supports 14 and 16 may be mounted so as to twist about the longitudinal axis 28 as conductor supports 14 and 16 move together about the longitudinal axis 28 as indicated by arrow 98. This relative rotation between conductor supports 14 and 16 causes angulation of the longitudinal conductors 18 from parallel to longitudinal axis 28 decreasing their length along the longitudinal axis 28 without the need to bend the longitudinal conductors 18 except at their junctions to the conductor supports 14 and 16. As before, the ends of the longitudinal conductors may be permanently affixed to the respective circuit boards 74 and 80.

Referring now to FIG. 12 in an alternative embodiment, the tubes 68 that telescope to provide an insulating sheath may have corresponding conductive tubes 100 within them. Each conductive tube 100 is assembled in telescoping fashion and has a diameter to fit within the preceding conductive tube 100 if any and to be retained by opposing flanges 102 on each end of the two conductive tubes 100. The tubes themselves may be metallic so as to provide conduction and their junctures may be enhanced by spring-biased brushes 104 according to techniques well known in the art of radio antennas and the like.

Referring now to FIGS. 13a and 13b in a variation on FIG. 12, the longitudinal conductors 18 may be composed of interengaging tracks 106 having insulating and conductive portions. The tracks may interengage by means of a dovetail joint formed between the tracks, one side of which holds a metallic conductor 108 and the other side of which holds a spring conductor 110 that provides a continuous path of conduction between the conductor 108 and a conductor 112 as the tracks 106 slide with respect to each other. A set of several such interengaging tracks 106 provides the longitudinal conductors 18.

Referring now to FIGS. 14a and 14b, in yet a further embodiment, the longitudinal conductors 18 may be composed of metal and possibly plastic fibers in a braided sheath 120. The braided sheath 120 may be fit about a telescoping mandrel 122 providing it with support and precise location when it is in an extended configuration. Compression of the braided sheath 120 shown in FIG. 14b causes it to expand in diameter 123 to take up the slack caused by the conductor supports 14 and 16 moving together. An insulating braid (not shown) may be placed about the surface of the conductive braided sheath 120.

Referring now to FIG. 15, in an embodiment that does not provide some of the advantages of the foregoing embodiments, the longitudinal conductors 18 and their sheathing may be rigid and may pass through holes in the conductor support 16 with movement of the conductor support 14 longitudinally as indicated by arrow 124. The longitudinal conductors 18 are permanently attached to a circuit board 74 (not shown) in the conductor support 14. Electrical connectors 126 on the ends of the longitudinal conductors 18 allow the longitudinal conductors 18 to connect electrical connectors 128 on circuit board 80 (not shown) in the conductor support 16 when the conductor supports 14 and 16 are fully separated.

Referring now to FIGS. 16a and 16b, in yet an alternative embodiment, longitudinal conductors 18 may be formed from a flexible conductor 132, for example, metal foil, laminated to a springy support 130 having memory holding it in a reduced length configurations, for example, as shown here in a corrugated fold. Extension of the conductor supports 14 and 16 stretches out the springy support 130 and flexible conductor 132 as shown in FIG. 16b. Such an approach may be used within a separate sheath or independently with flexible insulation placed on both sides of the flexible conductor 132.

Referring now to FIGS. 17a and 17b, in an alternative embodiment, flexible conductors and insulators of longitudinal conductors 18 may simply be draped to the left and right of the conductor supports 14 and 16 possibly assisted by retractor elastic 133 or the like, when the conductor supports 14 and 16 are moved together.

FIG. 18 shows a variation on the retractor reel of FIG. 6 in which each conductor 72 is associated with a separate spring driven reel 134 mounted on the circuit board 80 at the point where the conductor 72 enters the housing of the conductor support 16. The reels 134 take up the conductor 172 as the conductor supports 14 and 16 (not shown) are moved together. Electrical conduction to the end of the conductor 72 at the conductor support 16 may be obtained by a slip ring system or by a connector system shown in FIG. 9 in which conductor 72 at fill extension has a conductive collar 136 that engages a corresponding electrical connector 138 attached to the circuit board 80 within the conductor support 16. In this case, it is noted that no electrical connection is required between conductor 72 and the remainder of the coil structure held by the printed circuit board 80 except during full extension.

It will be noted in this regard that the drastic change in geometry of the coil 10 in its compressed and extended form ensures that the coil 10 is detuned when in its shortened form preventing incidental and possibly damaging resonance currents from forming.

Referring now to FIG. 20, the braid system shown in FIGS. 14a and 14b may also provide for collapsing about a central mandrel by a convolution of the braided sheath 120 folding in among itself in concentric fashion.

Referring to FIG. 21, an alternative method of creating the longitudinal conductors 18 includes a planer spiral 140 whose center 142 may be attached to one circuit board 74 shown in FIG. 6, and whose outer end 144 may be attached to circuit board 80 in conductor support 16. When the conductor supports 14 and 16 are close together, the spiral 140 assumes a more planar configuration and while the conductor supports 14 and 16 are fully extended, the spiral 140 assumes a twisted linear form.

Referring to FIG. 22, an alternative mechanism to the reel structure of FIG. 6 provides for a rotating cam plate 146 rotating about a longitudinal axis and held within the housing of conductor support 16. Cam followers 148 follow cam surfaces on the cam plate 146 which spiral inward. The flexible conductors 72 are diverted along the cam plate 146 by idler pulleys 150 being similar to pulleys 76 of FIG. 7 but having circumferential axes of rotations to direct the conductor 72 in a radial fashion along cam plate 146. Rotation of the cam plate 146 causes pulling inward of the cam followers 148 toward the center of the cam plate 146 taking up the requisite slack.

Referring now to FIG. 23, the longitudinal conductors 18 beneath the head support 22 need not be so shortened as they do not interfere with access by the patient's head to the cylindrical volume 12. Accordingly, two longitudinal conductors 18' beneath or within the head support 22 may be permanently in extended form and may electrically join to the other longitudinal conductors 18 when the conductor support 14 is in full extension position. Alternatively, in the phased array configuration, such joining may not be required. In this way, the conductor support 14 need not be a continuous ring that surrounds the head support 22 but may be U-shaped.

It is specifically intended that the present invention not be limited to the embodiments and illustrations contained herein, but include modified forms of those embodiments including portions of the embodiments and different combinations of elements of different embodiments as come within the scope of the following claims.

We claim:

1. An MRI head coil comprising:
   a longitudinally extending head support sized to support the head of a supine patient;

a first conductor support positioned superior to the patient's head when the patient's head is on the head support;

a second conductor support having an opening for receiving the head support therethrough and mounted to move longitudinally with respect to the head support and the first conductor support between a first position toward the first conductor support and a second position away from the first conductor support; and a set of conductors extending longitudinally between the first and second conductor supports when the second conductor support is in the second position to define, together with the first and second conductor supports, a volume substantially enclosing the patient's head with the patient's head supported on the patient support;

whereby improved patient positioning on the head support may be obtained by moving the second conductor support to the first position and imaging may be conducted with the second conductor support to the second position.

2. The MRI head coil of claim 1 wherein the first conductor support is mounted relative to the head support to remove longitudinally with respect to the head support.

3. The MRI head coil of claim 1 wherein the first and second conductor supports and head support are mounted on a base sized to be received on a patient table.

4. The MRI head coil of claim 1 wherein the second conductor support is a ring and surrounds the head support.

5. The MRI head coil of claim 1 wherein the second conductor support is a U having arms flanking a stationary base and wherein the base includes longitudinal conductors.

6. The MRI head coil of claim 1 wherein the longitudinal conductors are interconnected with conductors in the first and second conductor supports to form a birdcage coil.

7. The MRI head coil of claim 1 wherein the longitudinal conductors are interconnected with conductors in the first and second conductor supports to form a phased array coil.

8. The MRI head coil of claim 1 wherein the longitudinal conductors form a resonant circuit tuned to an NMR frequency when the second conductor support is in the second position and are detuned when the second conductor is in the second position.

9. The MRI head coil of claim 1 wherein the second conductor support includes a removable bridge portion over a portion of the opening passing by the patient's nose and mouth when the patient's head is on the patient support and the second conductor support is moved from the first position to the second position.

10. The MRI head coil of claim 1 wherein the removable bridge portion includes wiring connecting longitudinal conductors.

11. The MRI head coil of claim 1 wherein the bridge is wide enough to pass a standard endotracheal tube in an intubated patient.

12. The MRI head coil of claim 1 wherein the longitudinal conductors include a telescoping outer insulating sheath collapsing when the second conductor support is in the first position toward the first conductor support.

13. The MRI head coil of claim 1 wherein the longitudinal conductors include a jointed sheath articulating when the second conductor support is in the first position toward the first conductor support.

14. The MRI head coil of claim 1 wherein the longitudinal conductors include a flexible insulating sheath bending when the second conductor support is in the first position toward the first conductor support.

15. The MRI head coil of claim 1 wherein the longitudinal conductors include a rigid insulating sheath passing through the first conductor support when the second conductor support is in the first position toward the first conductor support.

16. The MRI head coil of claim 1 wherein the longitudinal conductors are flexible metal members.

17. The MRI head coil of claim 1 wherein the longitudinal conductors are a braided metal member.

18. The MRI head coil of claim 17 member bends.

19. The MRI head coil of claim 17 member expands and contracts in cross section.

20. The MRI head coil of claim 17 member convolves on itself.

21. The MRI head coil of claim 1 wherein the longitudinal conductors are wire.

22. The MRI head coil of claim 1 wherein the longitudinal conductors include a series of conductor segments joined by electrical connectors when the second conductor support is in the second position.

23. The MRI head coil of claim 1 wherein the segments are segments of telescoping metal tubes.

24. The MRI head coil of claim 1 wherein the segments are segments of inter-engaging tracks.

25. The MRI head coil of claim 1 wherein the longitudinal conductors are flexible and wherein the first conductor support houses a retraction mechanism.

26. The MRI head coil of claim 1 wherein the retraction mechanism is a reel having a longitudinal axis for winding the longitudinal conductors upon.

27. The MRI head coil of claim 1 wherein the retraction mechanism is multiple reels each associated with one longitudinal conductor.

28. The MRI head coil of claim 1 wherein the retraction mechanism is a cam plate having cam followers attached to ends of the longitudinal conductors.

29. The MRI head coil of claim 1 wherein the longitudinal conductors are flexible and include a self wider positioned along their length to wind up the conductor when the second conductor support is in the second position near the first conductor support.

* * * * *